(12) United States Patent
Kim

(10) Patent No.: US 7,535,777 B2
(45) Date of Patent: May 19, 2009

(54) DRIVING SIGNAL GENERATOR FOR BIT LINE SENSE AMPLIFIER DRIVER

(75) Inventor: Dong-Keun Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 180 days.

(21) Appl. No.: 11/529,283

(22) Filed: Sep. 29, 2006

(65) Prior Publication Data

US 2007/0070711 A1    Mar. 29, 2007

(30) Foreign Application Priority Data

Sep. 29, 2005   (KR) ...................... 10-2005-0090880
May 30, 2006    (KR) ...................... 10-2006-0049006

(51) Int. Cl.
*G11C 7/08*   (2006.01)
*G11C 7/22*   (2006.01)

(52) U.S. Cl. .................. 365/189.16; 365/194; 365/196; 365/189.11; 365/189.08; 327/55; 327/52

(58) Field of Classification Search ................ 365/194, 365/195, 196, 191, 189.16, 189.11, 189.08; 327/55, 54, 52
See application file for complete search history.

(56) References Cited

U.S. PATENT DOCUMENTS

| 5,966,337 | A | 10/1999 | Lee et al. | |
|---|---|---|---|---|
| 6,043,685 | A | 3/2000 | Lee | |
| 6,097,653 | A | 8/2000 | Park | |
| 6,347,058 | B1 | 2/2002 | Houghton et al. | |
| 6,615,331 | B1 * | 9/2003 | Morzano | .................... 711/167 |
| 7,305,516 | B2 * | 12/2007 | Lee et al. | .................... 711/105 |
| 2006/0250883 | A1 * | 11/2006 | Szczypinski | ................ 365/233 |

FOREIGN PATENT DOCUMENTS

| JP | 10-340583 A | 12/1998 |
|---|---|---|
| KR | 2002-0032394 | 5/2002 |
| KR | 1020050041055 | 5/2005 |
| KR | 1020050097153 | 10/2005 |
| KR | 1020050106833 | 11/2005 |

OTHER PUBLICATIONS

Korean Office Action issued in Korean Patent Application No. KR 10-2006-0049006, mailed Apr. 30, 2007.
Korean Office Action, issued in corresponding Korean Patent Application No. 9-5-2007-051409237 issued on Sep. 21, 2007.

* cited by examiner

*Primary Examiner*—Andrew Q Tran
(74) *Attorney, Agent, or Firm*—Mannava & Kang, P.C.

(57) ABSTRACT

A semiconductor memory device includes an over driver for driving a pull-up power line of a bit line sense amplifier by an over driving signal, a normal driver for driving the pull-up power line of the bit line sense amplifier by a normal driving signal, and a driving signal generating circuit, in response to a write signal, for generating a driving signal to drive the over driver for a predetermined interval and thereafter to drive the normal driver.

8 Claims, 5 Drawing Sheets

DRIVING SIGNAL GENERATOR FOR BIT LINE SENSE AMPLIFIER DRIVER

FIELD OF THE INVENTION

The present invention relates to semiconductor design technologies, and more particularly, to a bit line sense amplifier driver control circuit which controls a bit line sense amplifier upon a write operation.

DESCRIPTION OF RELATED ARTS

A conventional semiconductor memory device is shown in the circuit diagram of FIG. 1.

Referring to FIG. 1, the conventional semiconductor memory device includes a cell array 106 having a plurality of unit memory cells, a bit line sense amplifier 105 for amplifying data or charge applied to bit lines BL and BLb, a bit line sense amplifier driver 104 for driving power lines RTO and Sb of the bit line sense amplifier 105, a YI transistor YIT for connecting the bit lines BL and BLb and the segment input/output lines SIO and SIOb respectively, an SIO transistor SOIT for connecting the segment input/output lines SIO and SIOb and local input/output lines LIO and LIOb respectively, a data bus sense amplifier (IOSA) 103 for transferring data to a global input/output line GIO, a write driver (WDRV) 102 for writing input data applied to unit memory cells, the global input/output line GIO connected to the WDRV 102 and the IOSA 103 for forwarding data, and an input/output pad 101 connected to the global input/output line GIO for transferring data to/from an external unit.

In the conventional semiconductor memory device as configured above, read/write operations are carried out as follows. Upon the write operation, data to be written, applied to the input/output pad 101, is first fed to the WDRV 102 via the global input/output line GIO. And then, the data is delivered to the segment input/output lines SIO and SIOb via the local input/output lines LIO and LIOb. Thereafter, the data is sent to the bit lines BL and BLb by way of the YI transistor YIT and, lastly, written in the unit memory cells.

The read operation progresses in reverse order of the write operation, in which the data is forwarded to the pad 101 by way of the IOSA 105 in lieu of the WDRV 103.

The bit line sense amplifier (SA) driver 104, which controls the bit line sense amplifier 105 to amplify data provided from the memory cells, serves to control such amplification operation by applying a pull-up voltage VCORE and a pull-down voltage VSS to the pull-up power line RTO and the pull-down power line Sb of the bit line sense amplifier 105, respectively.

In this arrangement, if voltage levels of the pair of segment input/output lines SIO and SIOb are the same as those of the pair of bit lines BL and BLb, an existing state is maintained. But, if the voltage levels of the pair of segment input/output lines SIO and SIOb are opposite to those of the pair of bit lines BL and BLb, the voltage levels of the pair of bit lines BL and BLb are inverted by a driving power of latch transistors of the bit line amplifier 105. However, capacitance of the pair of bit lines BL and BLb is large, and particularly, a resistor of a storage node SN that is coupled with the memory cells and the pair of bit lines BL and BLb is very large, thereby requiring significant time for conveying data with sufficient voltage level.

SUMMARY OF THE INVENTION

It is, therefore, an object of the present invention to provide a driving signal generating circuit for a bit line sense amplifier driver which is capable of improving driving power of the bit line sense amplifier upon a write operation, and a semiconductor memory device having the same.

In accordance with one aspect of the present invention, there is provided a semiconductor memory device including: an over driver for driving a pull-up power line of a bit line sense amplifier by an over driving signal; a normal driver for driving the pull-up power line of the bit line sense amplifier by a normal driving signal; and a driving signal generating circuit, in response to a write signal, for generating a driving signal to drive the over driver for a predetermined interval and thereafter to drive the normal driver.

In accordance with another aspect of the present invention, there is provided a driving signal generating circuit for a bit line sense amplifier driver which is provided to drive the bit line sense amplifier and control an over driver driven by an over driving signal and a normal driver driven by a normal driving signal in a semiconductor memory device, including: a delay circuit for delaying a write signal; a first inverter for inverting an output signal of the delay circuit; a first level shifter for level-shifting an output signal of the first inverter to output the over driving signal; a second inverter for inverting an enable signal of the driving signal generating circuit; a third inverter for inverting an output signal of the second inverter; a second level shifter for level-shifting an output signal of the third inverter to provide the pull-down driving signal; a first NAND gate for receiving and NAND-operating output signals of the first and the second inverters; a fourth inverter for inverting an output signal of the first NAND gate; and a third level shifter for level-shifting an output signal of the fourth inverter to produce the normal driving signal.

Other objectives and advantages of the invention will be understood by the following description and will also be appreciated by the embodiments of the invention more clearly.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, preferred embodiments of the present invention will be set forth in detail with reference to the accompanying drawings to the extent that the invention can be readily carried out by those in the art to which the invention pertains.

Figure 1:
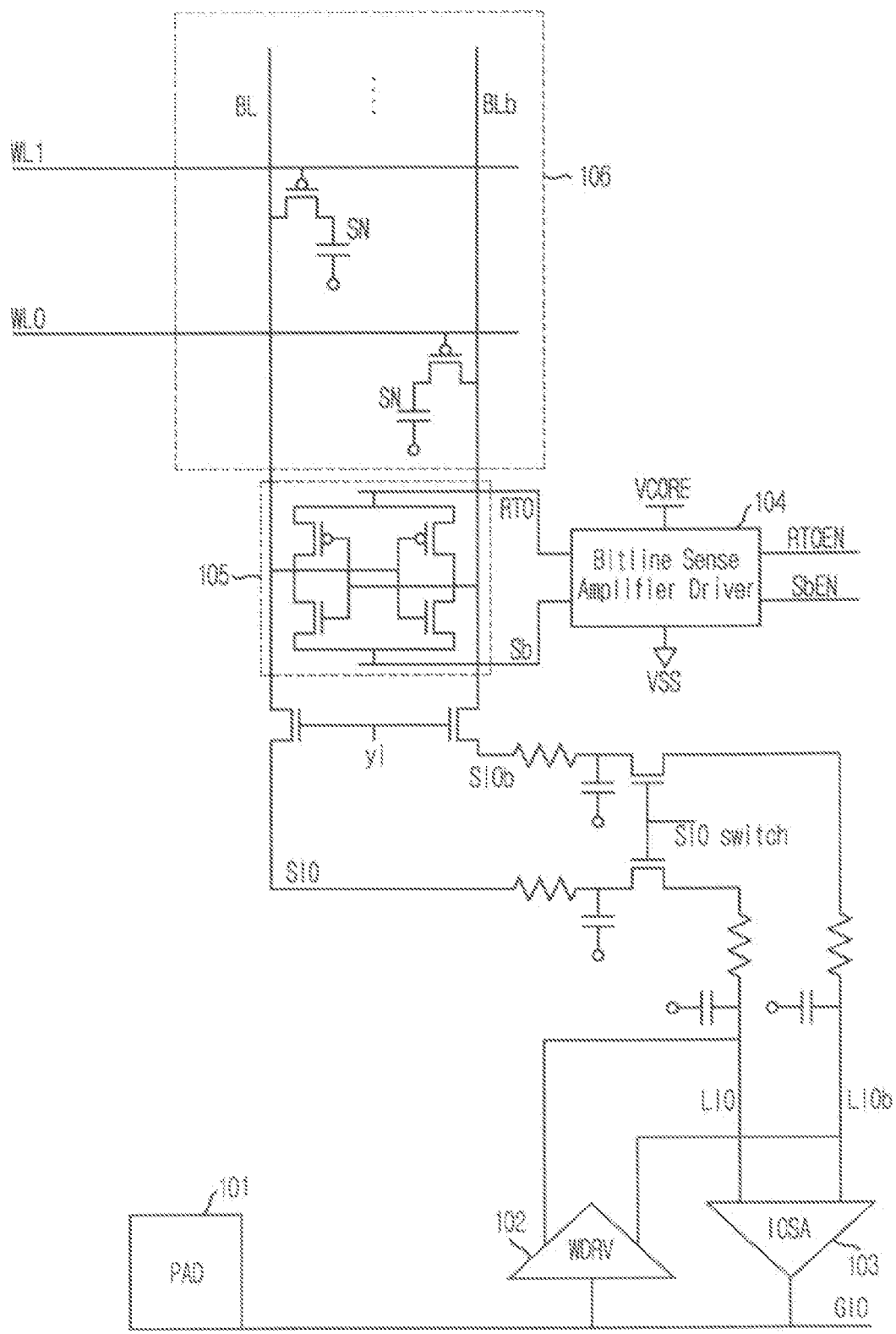
FIG. 1 is a circuit diagram of a conventional semiconductor memory device.
Figure 2:
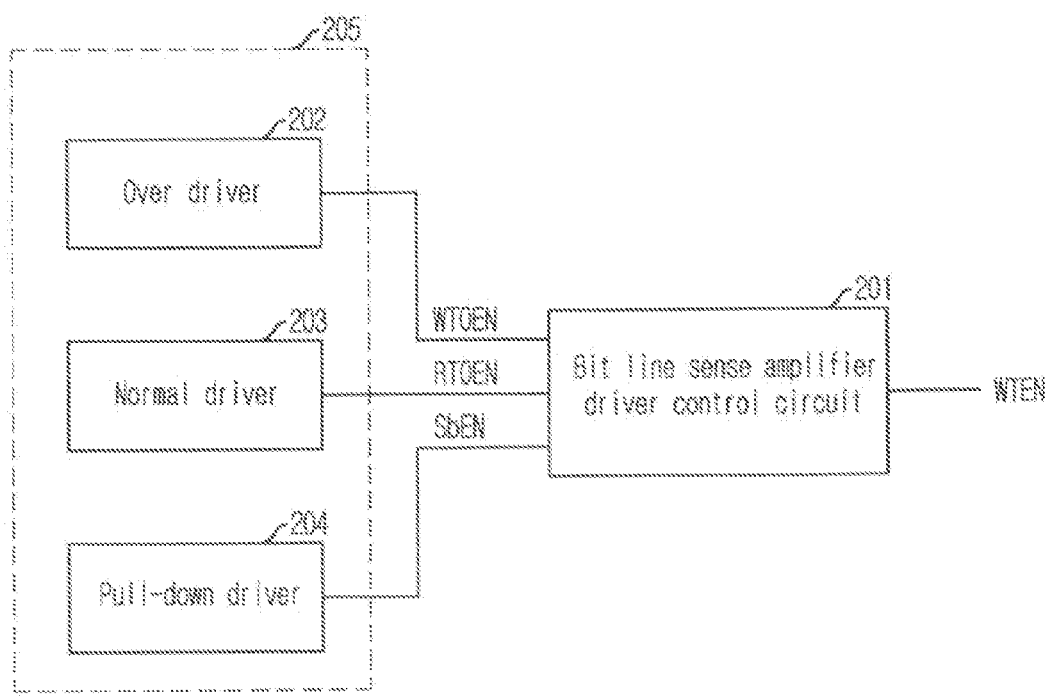
FIG. 2 is a block diagram of a bit line sense amplifier driver control circuit in accordance with a preferred embodiment of the present invention.

FIG. 2 is a block diagram of a bit line sense amplifier driver control circuit of a semiconductor memory device in accordance with a preferred embodiment of the present invention.

Referring to FIG. 2, the bit line sense amplifier driver control circuit 201, in response to a write enable signal WTEN denoting a write operation, conveys an over driving signal WTOEN to an over driver 202 included in a bit line sense amplifier driver 205, a normal driving signal RTOEN to a normal driver 203 therein, and a pull-down driving signal SbEN to a pull-down driver 204.

A detailed description of the bit line sense amplifier driver control circuit 201 will be given below on the basis of the above conceptual diagram.

Figure 3:
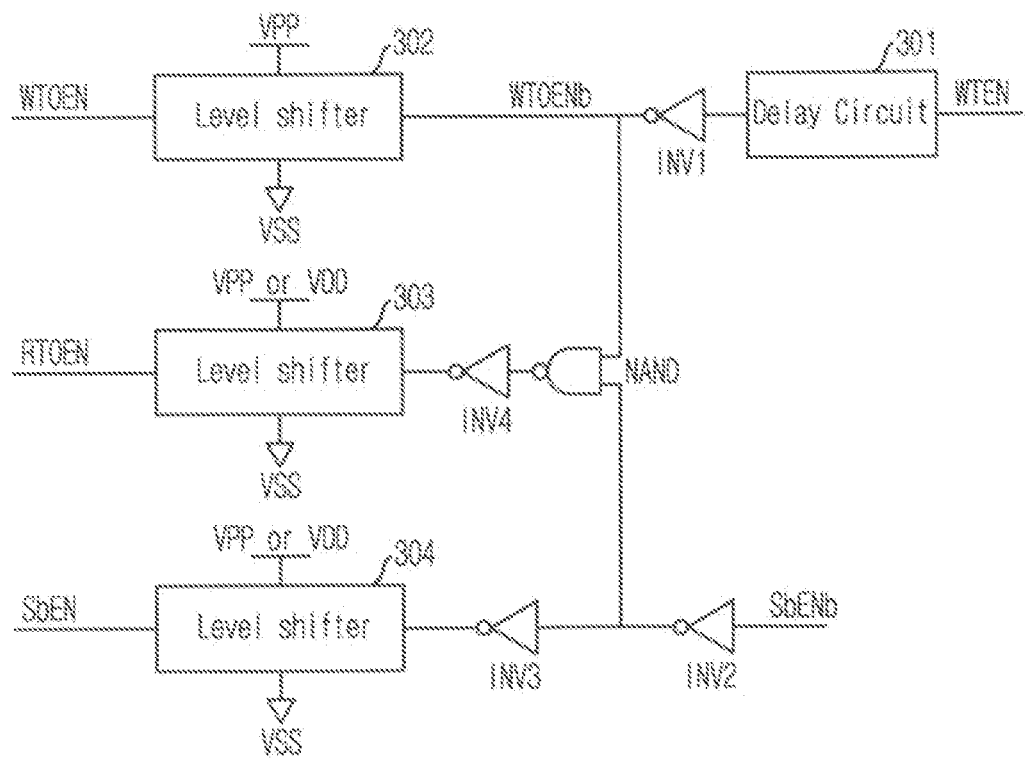
FIG. 3 is a detailed circuit diagram of the bit line sense amplifier driver control circuit shown in FIG. 2.

FIG. 3 is a detailed circuit diagram of the bit line sense amplifier driver control circuit 201 shown in FIG. 2.

Referring to FIG. 3, the bit line sense amplifier driver control circuit 201 generates the over driving signal WTOEN, the normal driving signal RTOEN, and the pull-down driving signal SbEN for driving the bit line sense amplifier driver having the over driver, the normal driver and the pull-down driver.

The bit line sense amplifier driver control circuit 201 includes a delay circuit 301 for delaying a write enable signal WTEN, a first inverter INV1 for inverting an output signal of the delay circuit 301 to provide a delay write enable signal WTOENb, a first level shifter 302 for level-shifting the delay write enable signal WTOENb to output the over driving signal WTOEN, a second inverter INV2 for inverting a bit line sense amplifier driver enable signal SbENb, a third inverter INV3 for inverting an output signal of the second inverter INV2, a third level shifter 304 for level-shifting an output signal of the third inverter INV3 to produce the pull-down driving signal SbEN, a first NAND gate NAND for receiving and NAND-operating the output signal of the second inverter INV2 and the delay write enable signal WTOENb, a fourth inverter INV4 for inverting an output signal of the first NAND gate NAND, and a second level shifter 303 for level-shifting an output signal of the fourth inverter INV4 to provide the normal driving signal RTOEN.

In this configuration, the delay circuit 301 is made in such a manner that a YI transistor connecting the bit lines and the segment input/output lines has delay time information within a driving time.

A timing diagram of the bit line sense amplifier driver control circuit 201 is described below with reference to the timing diagram of FIG. 4.

Figure 4:
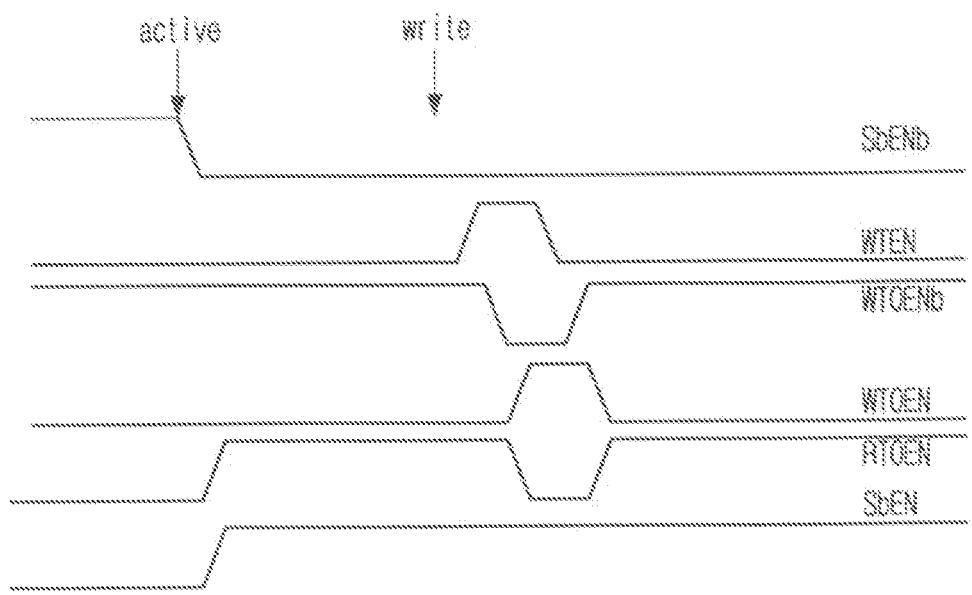
FIG. 4 is a timing diagram for explaining an operation of the bit line sense amplifier driver control circuit shown in FIG. 3.

Referring to FIG. 4, when the semiconductor memory device performs an active operation by an active signal active, the bit line sense amplifier driver selected by external address information is driven by the bit line sense amplifier enable signal SbENb. At this time, a write command write is in an inactivation state, and therefore, the write enable signal WTEN is in an inactivation state. Accordingly, the normal driving signal RTOEN becomes activated and also the pull-down driving signal SbEN becomes activated, but the over driving signal WTOEN becomes inactivated. That is, a normal driving operation of the bit line sense amplifier is conducted.

Subsequently, when the write command write is input, the write enable signal WTEN becomes activated; and after delay of a certain time, the over driving signal WTOEN becomes activated and the normal driving signal RTOEN becomes inactivated.

The over driving signal WTOEN, the normal driving signal RTOEN, and the pull-down driving signal SbEN thus generated are then provided to the bit line sense amplifier driver.

Figure 5:
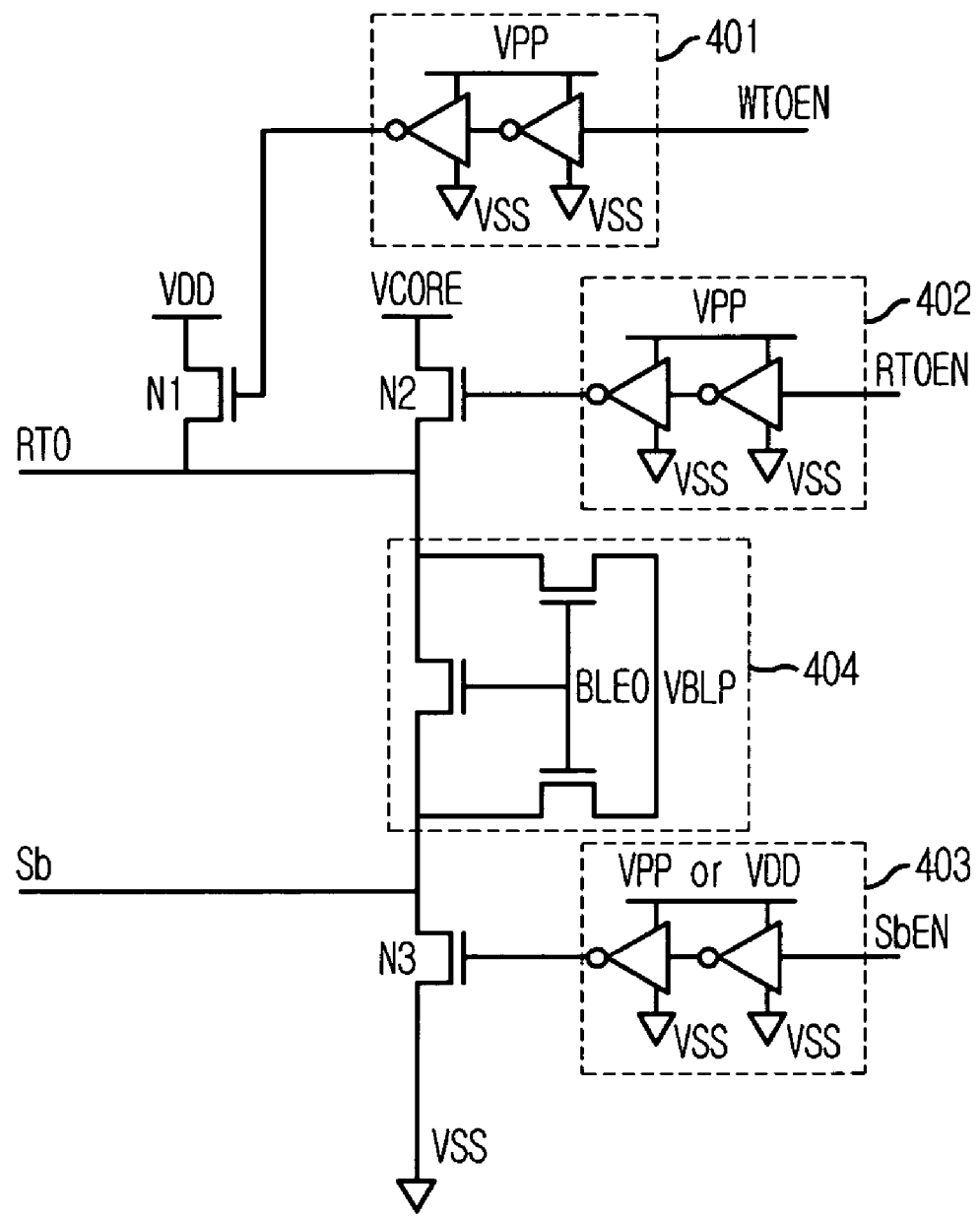
FIG. 5 is a detailed circuit diagram of the bit line sense amplifier driver shown in FIG. 2.

FIG. 5 is a detailed circuit diagram of the bit line sense amplifier driver 205 shown in FIG. 2.

Referring to FIG. 5, the bit line sense amplifier driver 205 is provided with first to third buffers 401 to 403, an over driver N1, a normal driver N2, and a pull-down driver N3. Specifically, the first buffer 401 buffers an over driving signal WTOEN, and the over driver N1 receives the over driving signal WTOEN buffered by the first buffer 401 via its gate and drives a pull-up power line RTO of the bit line amplifier by a power supply voltage VDD. The second buffer 402 buffers a normal driving signal RTOEN, and the normal driver N2 receives the normal driving signal RTOEN buffered by the second buffer 402 via its gate and drives the pull-up power line RTO of the bit line amplifier by a core voltage VCORE. The third buffer 403 buffers a pull-down driving signal SbEN, and the pull-down driver N3 receives the pull-down driving signal SbEN buffered by the third buffer 403 via its gate and drives a pull-down power line Sb of the bit line amplifier by a ground voltage VSS. In addition, the bit line sense amplifier driver 205 is further provided with a power line pre-charging unit 404 which equalizes and pre-charges the pull-up power line RTO and the pull-down power line Sb of the bit line sense amplifier.

In the illustrated arrangement, the over driver N1 and the normal driver N2 are connected in parallel to the pull-up power line RTO of the bit line sense amplifier.

Figure 6:
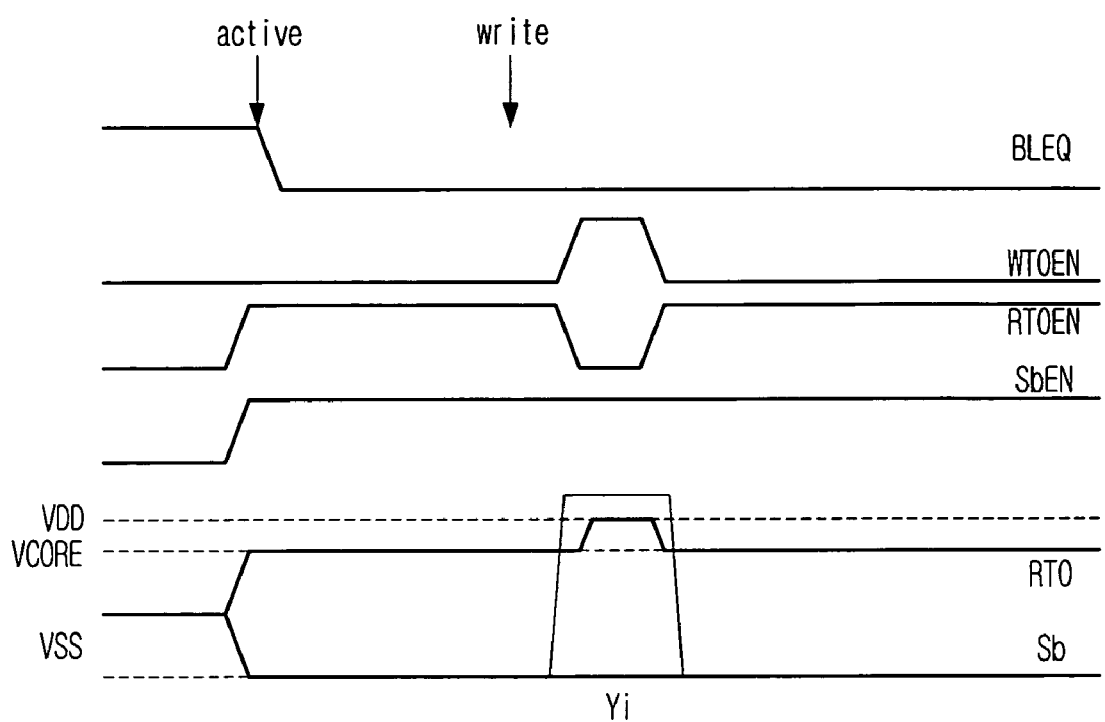
FIG. 6 is a timing diagram for describing an operation of the bit line sense amplifier driver shown in FIG. 5.

FIG. 6 is a timing diagram for explaining an operation of the bit line sense amplifier driver 205 shown in FIG. 5.

In FIG. 6, first of all, the generation of the over driving signal WTOEN, the normal driving signal RTOEN, and the pull-down driving signal SbEN by the active signal active and the write command write was discussed above referring to FIG. 3, and thus, details thereof will be omitted here for brevity.

Next, the pull-up power line RTO and the pull-down power line Sb of the bit line sense amplifier are driven in such that the bit line sense amplifier driver is driven by an active signal active and thus the normal driving signal RTOEN and the pull-down driving signal SbEN are activated, to thereby drive the pull-up power line RTO by the core voltage VCORE and the pull-down power line Sb by the ground voltage VSS.

In succession, the normal driving signal RTOEN becomes inactivated and the over driving signal WTOEN becomes activated, so that the pull-up power line RTO is driven by the power supply voltage VDD with higher voltage level than that of the core voltage VCORE.

At this time, the time when the pull-up power line RTO is driven by the power supply voltage VDD is dependent upon the delay time information of the delay circuit 301 as shown in FIG. 3. Since the delay time information is involved in the driving time of the YI transistor, the over driving operation of the pull-up power line is conducted within the driving time of the YI transistor.

As described above, in order to improve the driving power of the bit line sense amplifier in the method for writing data in the memory cells only by the driving power of the bit line sense amplifier, the present invention drives the pull-up power line of the bit line sense amplifier by the power supply voltage VDD as an over driving voltage which is higher than the core voltage VCORE as a normal driving voltage for a certain interval upon the write operation.

As a result, the present invention can increase a voltage level of a pull-up power supply voltage applied to the pull-up power line of the bit line sense amplifier for a certain interval upon an amplification operation that writes data from outside in the memory cells, thereby improving the driving power of the bit line sense amplifier and in turn allowing the semiconductor memory device to perform a more rapid and exact writing operation.

Furthermore, the present invention can provide a faster semiconductor memory device by reducing a write recovery time even when it is driven by a low voltage.

It should be noted that the logic gates and transistors illustrated in the preferred embodiment as mentioned above may be implemented in arrangement with equivalent elements, based on polarities of input and output signals used therein.

Further, it should be noted that the bit line sense amplifier driver control circuit 201 and the bit line sense amplifier driver 205 are implemented with a plurality of logic circuits in the preferred embodiment as described above, which is but one implementation example.

The present application contains subject matter related to Korean patent application Nos. 2005-90880 and 2006-49006, filed with the Korean Intellectual Property Office Sep. 29, 2005 and May 30, 2006, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
an over driver for driving a pull-up power line of a bit line sense amplifier by an over driving signal;
a normal driver for driving the pull-up power line of the bit line sense amplifier by a normal driving signal; and
a driving signal generating circuit, responsive to a write signal, for generating a driving signal to drive the over driver for a predetermined interval and then to drive the normal driver.

2. The semiconductor memory device as recited in claim 1, further comprising a pull-down driver for driving a pull-down power line of the bit line sense amplifier by a pull-down driving signal.

3. The semiconductor memory device as recited in claim 2, wherein the driving signal generating circuit generates the over driving signal for driving the over driver, the normal driving signal for driving the normal driver, and the pull-down driving signal for driving the pull-down driver.

4. The semiconductor memory device as recited in claim 3, wherein the driving signal generating circuit includes:
a delay circuit for delaying the write signal;
a first inverter for inverting an output signal of the delay circuit;
a first level shifter for level-shifting an output signal of the first inverter to output the over driving signal;
a second inverter for inverting an enable signal of the driving signal generating circuit;
a third inverter for inverting an output signal of the second inverter;
a second level shifter for level-shifting an output signal of the third inverter to provide the pull-down driving signal;
a first NAND gate for receiving and NAND-operating output signals of the first and the second inverters;
a fourth inverter for inverting an output signal of the first NAND gate; and
a third level shifter for level-shifting an output signal of the fourth inverter to produce the normal driving signal.

5. The semiconductor memory device as recited in claim 4, wherein the delay circuit comprises a YI transistor that connects bit lines and segment input/output lines, the YI transistor providing delay time information.

6. The semiconductor memory device as recited in claim 1, wherein the predetermined interval for which the over driver is driven is at least a driving time of a YI transistor that connects bit lines and segment input/output lines.

7. A driving signal generating circuit for a bit line sense amplifier driver which is provided to drive the bit line sense amplifier and control an over driver driven by an over driving signal and a normal driver driven by a normal driving signal in a semiconductor memory device, comprising:
a delay circuit for delaying a write signal;
a first inverter for inverting an output signal of the delay circuit;
a first level shifter for level-shifting an output signal of the first inverter to output the over driving signal;
a second inverter for inverting an enable signal of the driving signal generating circuit;
a third inverter for inverting an output signal of the second inverter;
a second level shifter for level-shifting an output signal of the third inverter to provide a pull-down driving signal;
a first NAND gate for receiving and NAND-operating output signals of the first and the second inverters;
a fourth inverter for inverting an output signal of the first NAND gate; and
a third level shifter for level-shifting an output signal of the fourth inverter to produce the normal driving signal.

8. The driving signal generating circuit as recited in claim 7, wherein the delay circuit has delay time information within a driving time of a YI transistor that connects bit lines and segment input/output lines.

* * * * *